(12) United States Patent
Zhang et al.

(10) Patent No.: US 11,284,539 B2
(45) Date of Patent: Mar. 22, 2022

(54) LOADING ASSEMBLY

(71) Applicants: Tyco Electronics (Shanghai) Co. Ltd., Shanghai (CN); Tyco Electronics AMP Qingdao Ltd, Qingdao (CN)

(72) Inventors: Jiefeng Zhang, Shanghai (CN); Zhiqiang Li, Shanghai (CN); Jianfeng Wang, Shanghai (CN); Guoxiao Shen, Shanghai (CN); Wei Zhao, Shanghai (CN); Jinqiang Wang, Qingdao (CN)

(73) Assignees: Tyco Electronics (Shanghai) Co., Ltd., Shanghai (CN); Tyco Electronics AMP Qingdao Ltd, Qingdao (CN)

( * ) Notice: Subject to any disclaimer, the term of this patent is extended or adjusted under 35 U.S.C. 154(b) by 0 days.

(21) Appl. No.: 16/984,289

(22) Filed: Aug. 4, 2020

(65) Prior Publication Data

US 2021/0045254 A1 Feb. 11, 2021

(30) Foreign Application Priority Data

Aug. 5, 2019 (CN) .......................... 201910718006.5

(51) Int. Cl.
*H05K 7/20* (2006.01)
*H05K 1/18* (2006.01)
*H05K 7/10* (2006.01)

(52) U.S. Cl.
CPC ............. *H05K 7/2049* (2013.01); *H05K 1/18* (2013.01); *H05K 7/1061* (2013.01)

(58) Field of Classification Search
None
See application file for complete search history.

(56) References Cited

U.S. PATENT DOCUMENTS 7,232,332 B2 * 6/2007 Osborn ............... H01L 23/4006
174/16.3

* cited by examiner

*Primary Examiner* — Ross N Gushi
(74) *Attorney, Agent, or Firm* — Barley Snyder (57) ABSTRACT

A loading assembly includes a base plate configured to support a circuit board placed thereon, a pressing plate configured to press an electrical member on the circuit board, and a first connection assembly connecting the pressing plate to the base plate and pressing the electrical member on the circuit board through the pressing plate. The first connection assembly includes a first nut fixed on the base plate, a first bolt passing through the pressing plate and screwed to the first nut, and a first spring sleeved on the first bolt and compressed between a head of the first bolt and the pressing plate. A first locking part is formed on the first bolt. The first locking part is pressed against an end face of the first nut when the first bolt is screwed to an installation position to prevent the first bolt from being rotated relative to the first nut.

22 Claims, 6 Drawing Sheets

LOADING ASSEMBLY

CROSS-REFERENCE TO RELATED APPLICATION

This application claims the benefit of the filing date under 35 U.S.C. § 119(a)-(d) of Chinese Patent Application No. 201910718006.5, filed on Aug. 5, 2019.

FIELD OF THE INVENTION

The present invention relates to a loading assembly and, more particularly, to a loading assembly adapted to load an electrical member on a circuit board.

BACKGROUND

In the prior art, a central processing unit (CPU) is generally loaded on a socket of a circuit board through a special loading mechanism, so that pins of the central processing unit electrically contact with the contact points on the circuit board. The loading mechanism usually includes a base plate, a pressing plate, and a connection assembly for connecting the pressing plate to the base plate. The circuit board is supported on the base plate, and the pressing plate presses the central processing unit on the circuit board. The connection assembly includes a nut fixed on the base plate, a bolt passing through the pressing plate and threaded to the nut, and a spring compressed between the pressing plate and the bolt head. When the bolt is screwed to its proper installation position, the spring is compressed and exerts a pressing pressure on the pressing plate to press the CPU on the circuit board.

In order to prevent the bolt from loosening, an additional locking thread sleeve is required, which is threaded to the bolt. When the bolt is screwed to the proper installation position, the end face of the locking thread sleeve abuts against the end face of the nut. However, in practical application, it is still possible for the bolt to be loosened due to rotation relative to the locking thread sleeve. In order to prevent the bolt from rotating and loosening, an adhesive is filled in a gap between the bolt and the locking thread sleeve, so as to bond the bolt and the locking thread sleeve together, and prevent the bolt from rotating and loosening relative to the locking thread sleeve. However, such solution to lock the bolt has high cost, and increases difficulty in installation of the loading mechanism.

SUMMARY

A loading assembly includes a base plate configured to support a circuit board placed thereon, a pressing plate configured to press an electrical member on the circuit board, and a first connection assembly connecting the pressing plate to the base plate and pressing the electrical member on the circuit board through the pressing plate. The first connection assembly includes a first nut fixed on the base plate, a first bolt passing through the pressing plate and screwed to the first nut, and a first spring sleeved on the first bolt and compressed between a head of the first bolt and the pressing plate. A first locking part is formed on the first bolt. The first locking part is pressed against an end face of the first nut when the first bolt is screwed to an installation position to prevent the first bolt from being rotated relative to the first nut.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EMBODIMENT(S)

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
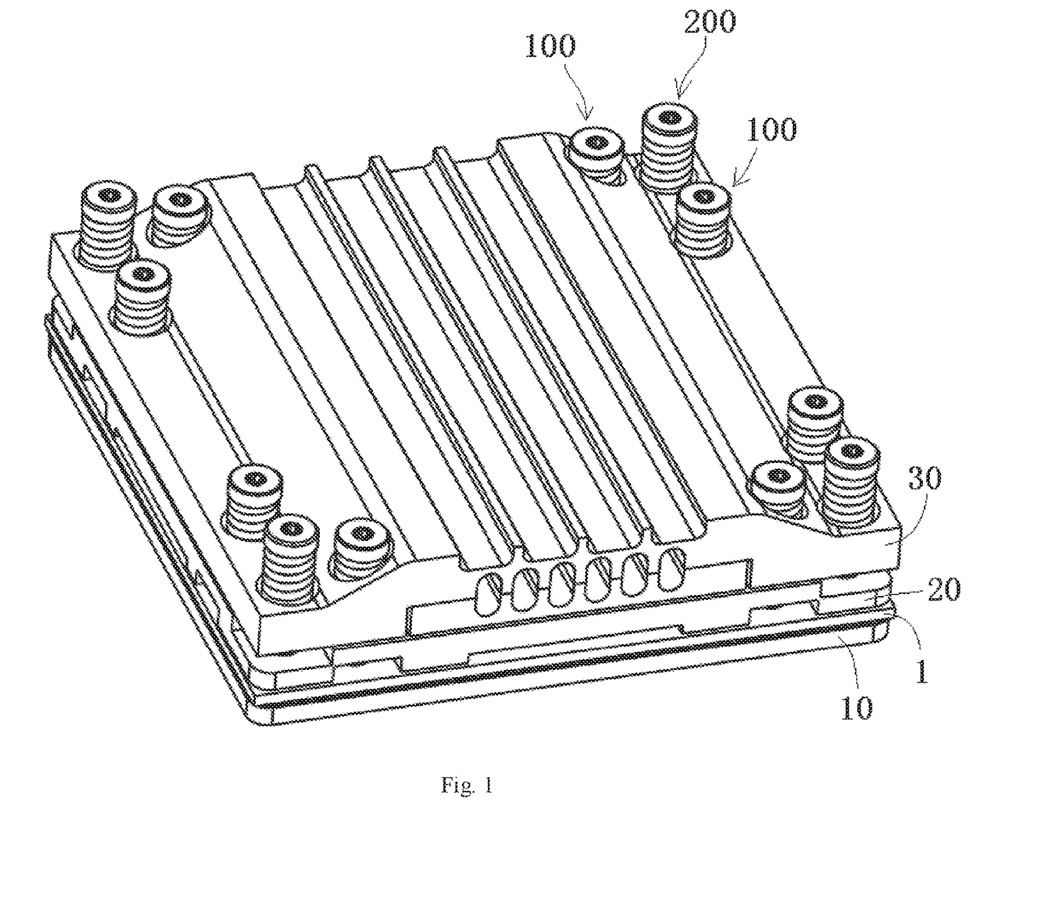
FIG. 1 is a perspective view of a loading assembly according to an embodiment.
Figure 5:
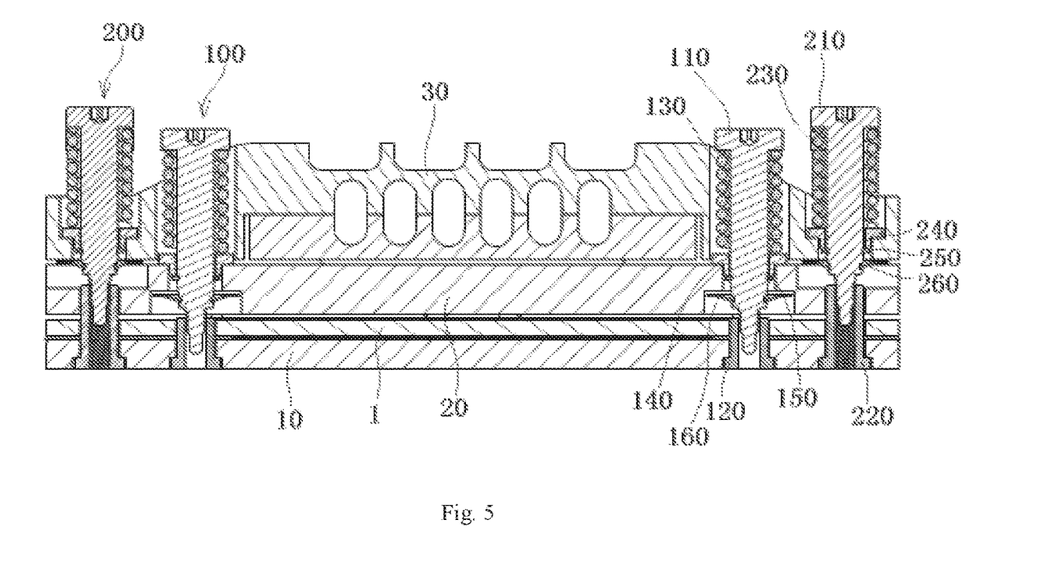
FIG. 5 is a sectional side view of the loading assembly with the first connection assembly or the second connection assembly in a pre-installation position.
Figure 6:
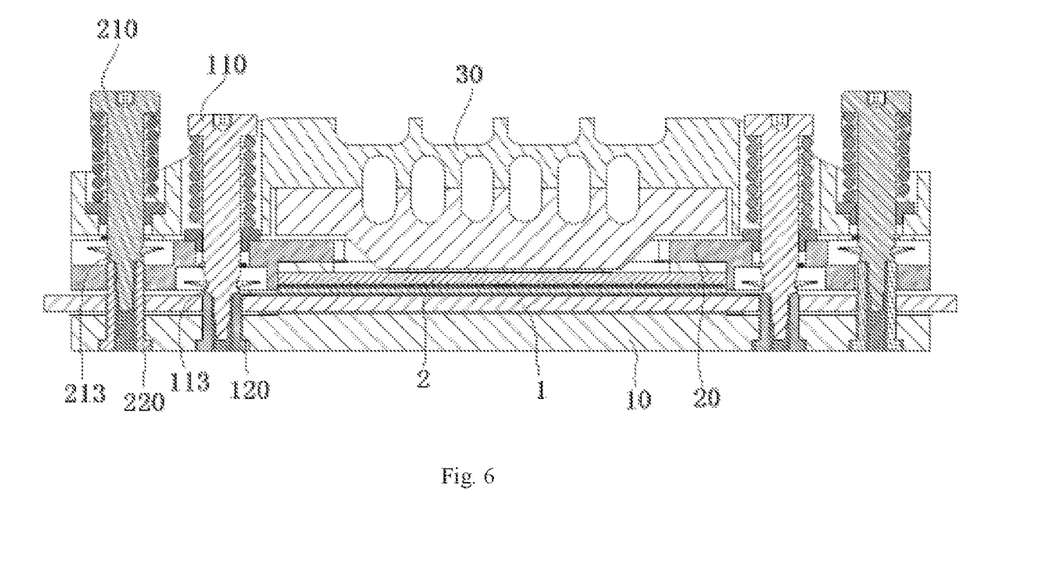
FIG. 6 is a sectional side view of the loading assembly with the first connection assembly or the second connection assembly in an installation position.

As shown in FIGS. 1 and 5-6, a loading assembly according to an embodiment comprises a base plate 10, a pressing plate 20, and a first connection assembly 100. The base plate 10 is configured to support a circuit board 1 placed thereon. The pressing plate 20 is configured to press an electrical member 2 on the circuit board 1. The first connection assembly 100 is adapted to connect the pressing plate 20 to the base plate 10 and press the electrical member 2 on the circuit board 1 through the pressing plate 20. In an exemplary embodiment of the present disclosure, the electrical member 2 may be a central processing unit or any other electronic chip.

As shown in FIGS. 1-6, in an embodiment, the first connection assembly 100 comprises a first nut 120, a first bolt 110, and a first spring 130. The first nut 120 is fixed on the base plate 10. The first bolt 110 passes through the pressing plate 20 and is screwed to the first nut 120. The first spring 130 is sleeved on or fitted over the first bolt 110 and compressed between a bolt head 111 of the first bolt 110 and the pressing plate 20.

Figure 7:
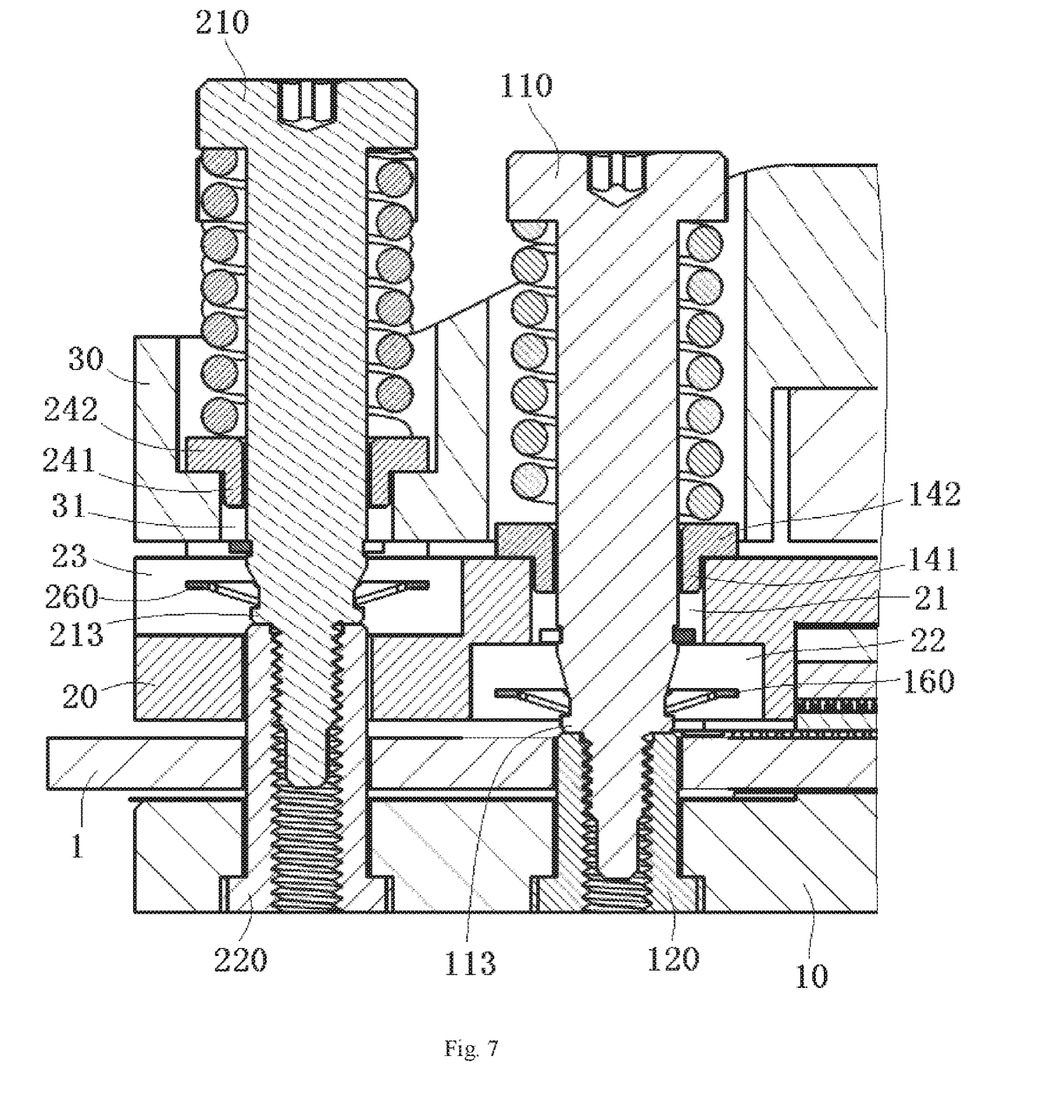
FIG. 7 is an enlarged view of a portion of the loading assembly of FIG. 6.

The first bolt 110, as shown in FIGS. 2, 4, 6, and 7, is formed with a first locking part 113. The first locking part 113 is located above a first thread portion (external thread) 114 of the first bolt 110 configured for mating with the first nut 120. As shown in FIGS. 6-7, in an embodiment, when the first bolt 110 is screwed to its suitable installation position, the first locking part 113 is pressed against an end face of the first nut 120 to prevent the first bolt 110 from being rotated relative to the first nut 120, so as to lock the first bolt 110 in its installation position.

The first connection assembly 100, as shown in FIGS. 2-5, has a first sleeve 140 which is sleeved on or fitted over a bolt rod 112 of the first bolt 110. The first sleeve 140 is adapted to be supported on the pressing plate 20. An upper end of the first spring 130 abuts against the head 111 of the first bolt 110, and a lower end of the first spring 130 abuts against the first sleeve 140.

Figure 2:
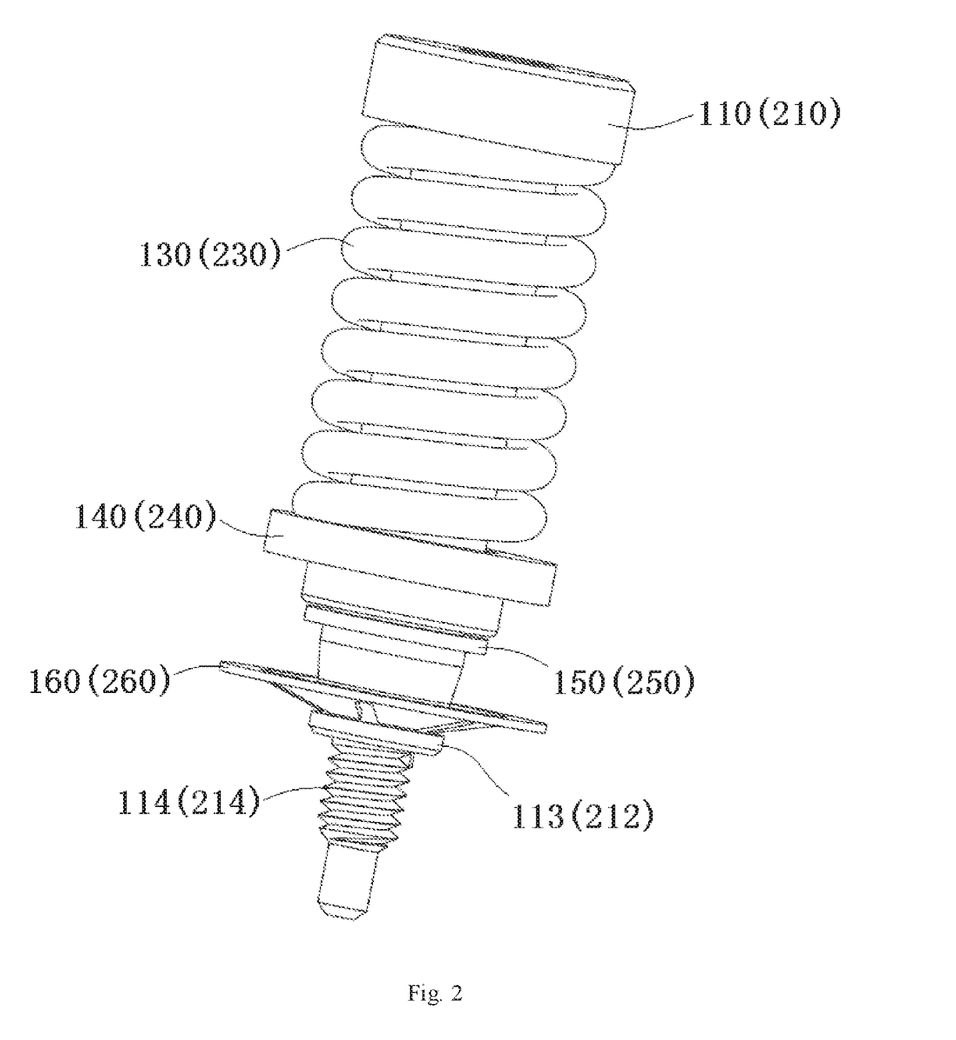
FIG. 2 is a perspective view of a first connection assembly or a second connection assembly of the loading assembly.
Figure 3:
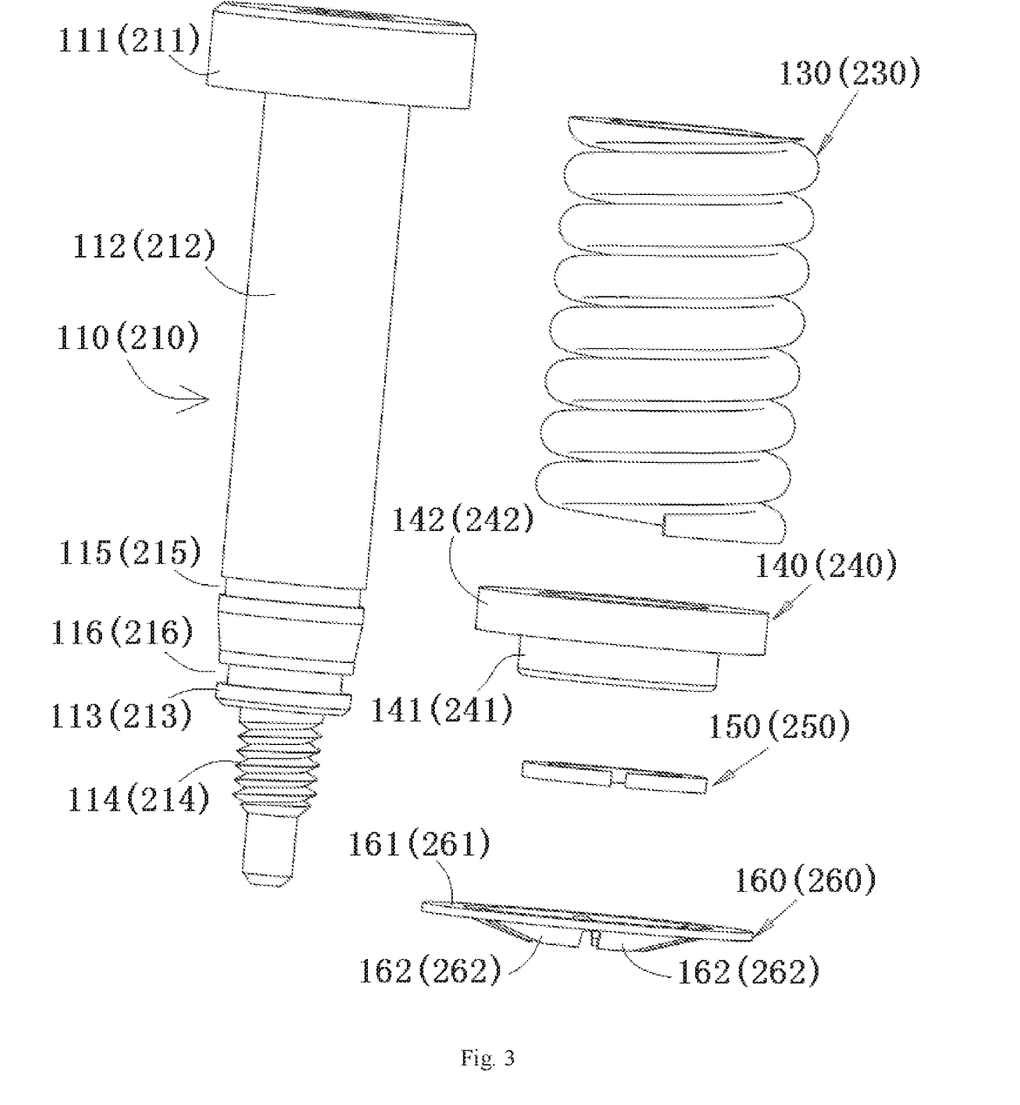
FIG. 3 is an exploded view of the first connection assembly or the second connection assembly.
Figure 4:
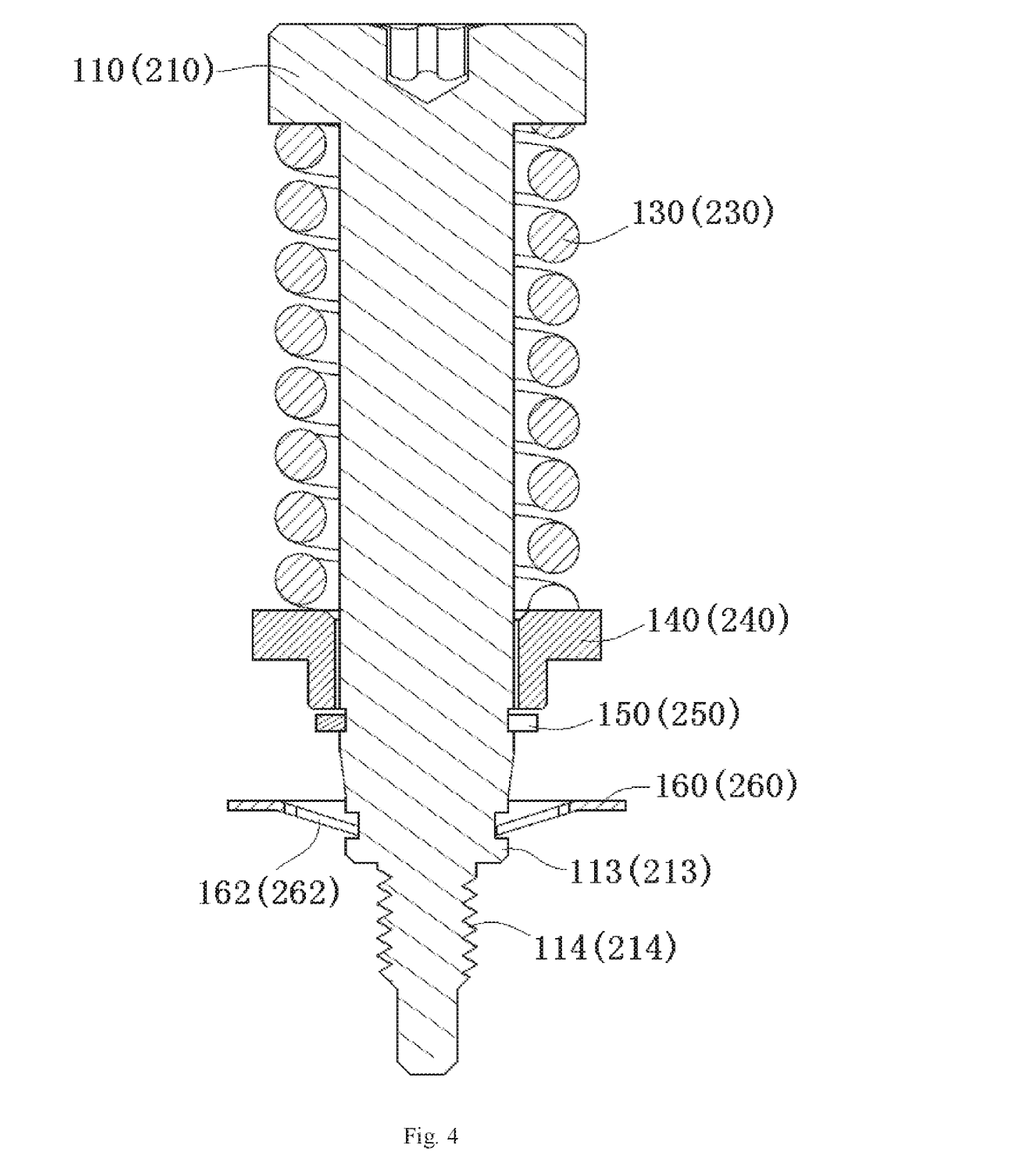
FIG. 4 is a sectional side view of the first connection assembly or the second connection assembly.

As shown in FIGS. 2-4, in an embodiment, a first ring groove 115 is formed in the rod 112 of the first bolt 110, and the first connection assembly 100 further comprises a first snap ring 150 held in the first ring groove 115 of the first bolt 110. The first snap ring 150 is located below the first sleeve 140 and configured to abut against a lower end face of the first sleeve 140, so as to prevent the first sleeve 140 from being separated from the first bolt 110.

As shown in FIGS. 3, 4, and 7, the first sleeve 140 has a tubular main body 141 and a flange 142 at an upper end of the tubular main body 141. The flange 142 protrudes outwards in a radial direction of the first sleeve 140. The tubular main body 141 of the first sleeve 140 is inserted into a first receiving hole 21 formed in the pressing plate 20, and the flange 142 of the first sleeve 140 is supported on an upper surface of the pressing plate 20. The upper end of the first spring 130 abuts against the head 111 of the first bolt 110, and the lower end of the first spring 130 abuts against the flange 142 of the first sleeve 140.

As shown in FIGS. 2-5, in an embodiment, a second ring groove 116 is formed on the rod 112 of the first bolt 110, and the first connection assembly 100 further comprises a first limit or snap-fit member 160 held in the second ring groove 116. The first snap-fit member 160 is located below the first receiving hole 21 of the pressing plate 20, and an outer diameter of the first snap-fit member 160 is larger than a diameter of the first receiving hole 21 of the pressing plate 20, so as to prevent the first bolt 110 from being pulled out of the first receiving hole 21 of the pressing plate 20.

The first snap-fit member 160, as shown in FIGS. 3 and 4, has a plate-shaped ring main body 161 and a plurality of elastic arms 162 extending downward obliquely from the plate-shaped ring main body 161. The plurality of elastic arms 162 are adapted to be latched in the second ring groove 116 of the first bolt 110, and an outer diameter of the plate-shaped ring main body 161 is larger than the diameter of the first receiving hole 21 of the pressing plate 20. In an embodiment, the plurality of elastic arms 162 of the first snap-fit member 160 surround the second ring groove 116 of the first bolt 110 and extend obliquely toward a center of the first bolt 110, so as to form barb structures for preventing the first bolt 110 from being pulled out upward relative to the first ring member 160. As shown in FIGS. 5 and 7, a first receiving chamber 22 is formed in the lower surface of the pressing plate 20, and the first snap-fit member 160 is received in the first receiving chamber 22 of the pressing plate 20.

The first locking part 113, as shown in FIGS. 3 and 4, is located between the second ring groove 116 and the first thread portion 114 of the first bolt 110. The first locking part 113 is a ring convex part formed on the rod 112 of the first bolt 110, and an end face of the first locking part 113 is adapted to be pressed against the end face of the first nut 120.

As shown in FIGS. 1 and 5-7, in an embodiment, the loading assembly further comprises a cooling plate 30 provided on the pressing plate 20. The cooling plate 30 has a bottom bulge which passes through an opening formed in the pressing plate 20 and contacts with the electrical member 2.

As shown in FIGS. 1-7, in an embodiment, the loading assembly further comprises a second connection assembly 200 for connecting the cooling plate 30 to the base plate 10. The second connection assembly 200 is adapted to apply an elastic pushing force on the cooling plate 30, so as to press the electrical member 2 on the circuit board 1 by means of the cooling plate 30. The second connection assembly 200 comprises a second nut 220, a second bolt 210, and a second spring 230. The second nut 220 is fixed on the base plate 10. The second bolt 210 passes through the cooling plate 30 and the pressing plate 20 and is screwed into the second nut 220. The second spring 230 is sleeved on or fitted over the second bolt 210 and compressed between a bolt head 211 of the second bolt 210 and the cooling plate 30.

As shown in FIGS. 3, 4, 6, and 7, in an embodiment, the second bolt 210 is formed with a second locking part 213, and the second locking part 213 is located above a second thread portion (external thread) 214 of the second bolt 210 configure to mate with the second nut 120. When the second bolt 210 is screwed to its installation position, the second locking part 213 is pressed against an end face of the second nut 220 to prevent the second bolt 210 from being rotated relative to the second nut 220, so as to lock the second bolt 210 at its installation position.

As shown in FIGS. 2-4, in an embodiment, the second connection assembly 200 further comprises a second sleeve 240 which is sleeved on or fitter over a bolt rod 212 of the second bolt 210, and the second sleeve 240 is adapted to be supported on the cooling plate 30. An upper end of the second spring 230 abuts against the head 211 of the second bolt 210, and a lower end of the second spring 230 abuts against the second sleeve 240.

As shown in FIGS. 2-4, a first ring groove 215 is formed in the rod 212 of the second bolt 210, and the second connection assembly 200 further comprises a second snap ring 250 held in the second ring groove 215 of the second bolt 210. The second snap ring 250 is located below the second sleeve 240 and configured to abut against a lower end face of the second sleeve 240, so as to prevent the second sleeve 240 from being separated from the second bolt 210.

As shown in FIGS. 3, 4, and 7, in an embodiment, the second sleeve 240 comprises a tubular main body 241 and a flange 242 at an upper end of the tubular main body 241, and the flange 242 protrudes outwards in a radial direction of the second sleeve 240. The tubular main body 241 of the second sleeve 240 is inserted into a second receiving hole 31 formed in the cooling plate 30, and the flange 242 of the second sleeve 240 is supported on the cooling plate 30. The upper end of the second spring 230 abuts against the head 211 of the second bolt 210, and the lower end of the second spring 230 abuts against the flange 242 of the second sleeve 240.

As shown in FIGS. 2-5 and 7, in an embodiment, a second ring groove 216 is formed in the rod 212 of the second bolt 210, and the second connection assembly 200 further comprises a second snap-fit member 260 held in the second ring groove 216. The second snap-fit member 260 is located below the second receiving hole 31 of the cooling plate 30, and an outer diameter of the second snap-fit member 260 is larger than a diameter of the second receiving hole 31 of the cooling plate 30, so as to prevent the second bolt 210 from being pulled out of the second receiving hole 31 of the cooling plate 30.

As shown in FIGS. 2-4 and 7, in an embodiment, the second snap-fit member 260 comprises a plate-shaped ring main body 261 and a plurality of elastic arms 262 extending downward obliquely from the plate-shaped ring main body 261. The plurality of elastic arms 262 are adapted to be latched in the second ring groove 216 of the second bolt 210, and an outer diameter of the plate-shaped ring main body 261 is larger than the diameter of the second receiving hole 31 of the cooling plate 30. The plurality of elastic arms 262 of the second snap-fit member 260 surround the second ring groove 216 of the second bolt 210 and extend obliquely toward a center of the second bolt 210, so as to form barb structures for preventing the second bolt 210 from being pulled out upward relative to the second ring member 260. As shown in FIG. 7, a second receiving chamber 23 is formed in the upper surface of the pressing plate 20, and the second snap-fit member 260 is received in the second receiving chamber 23 of the pressing plate 20.

As shown in FIGS. 1-7, in an embodiment, the second locking part 213 is located between the second ring groove 216 and the second thread portion 214 of the second bolt 210, the second locking part 213 is a ring convex part formed on the rod 212 of the second bolt 210, and an end face of the second locking part 213 is adapted to be pressed against the end face of the second nut 220.

As shown in FIGS. 1-7, in an embodiment, the first nut 120 and the second nut 220 each pass through the base plate 10 and the circuit board 1, so as to position the circuit board 1 on the base plate 10.

In various exemplary embodiments of the present disclosure, the loading assembly has a simple structure and thus reduced cost, and the installation thereof is simplified.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A loading assembly, comprising:
   a base plate configured to support a circuit board placed thereon;
   a pressing plate configured to press an electrical member on the circuit board; and
   a first connection assembly connecting the pressing plate to the base plate and pressing the electrical member on the circuit board through the pressing plate, the first connection assembly includes:
   a first nut fixed on the base plate,
   a first bolt passing through the pressing plate and screwed to the first nut,
   a first spring sleeved on the first bolt and compressed between a head of the first bolt and the pressing plate, a first locking part is formed on the first bolt, the first locking part is located above a first thread portion of the first bolt configured to mate with the first nut, the first locking part is pressed against an end face of the first nut when the first bolt is screwed to an installation position to prevent the first bolt from being rotated relative to the first nut to lock the first bolt at the installation position, and
   a first sleeve which is sleeved on a rod of the first bolt, the first sleeve is supported on the pressing plate, an upper end of the first spring abuts against the head of the first bolt and a lower end of the first spring abuts against the first sleeve.

2. The loading assembly according to claim 1, wherein a first ring groove is formed on the rod of the first bolt, the first connection assembly includes a first snap ring held in the first ring groove, the first snap ring is located below the first sleeve and abuts against a lower end face of the first sleeve to prevent the first sleeve from being separated from the first bolt.

3. The loading assembly according to claim 2, wherein the first sleeve has a tubular main body and a flange at an upper end of the tubular main body, the flange protruding outwards in a radial direction of the first sleeve, the tubular main body is inserted into a first receiving hole in the pressing plate and the flange of the first sleeve is supported on an upper surface of the pressing plate, the upper end of the first spring abuts against the head of the first bolt and the lower end of the first spring abuts against the flange of the first sleeve.

4. The loading assembly according to claim 3, wherein a second ring groove is formed on the rod of the first bolt and the first connection assembly includes a first snap-fit member held in the second ring groove, the first snap-fit member is located below the first receiving hole of the pressing plate, an outer diameter of the first snap-fit member is larger than a diameter of the first receiving hole of the pressing plate to prevent the first bolt from being pulled out of the first receiving hole of the pressing plate.

5. The loading assembly according to claim 4, wherein the first snap-fit member includes a plate-shaped ring main body and a plurality of elastic arms extending downward obliquely from the plate-shaped ring main body, the plurality of elastic arms are adapted to be latched in the second ring groove of the first bolt, and an outer diameter of the plate-shaped ring main body is larger than the diameter of the first receiving hole of the pressing plate.

6. The loading assembly according to claim 5, wherein the plurality of elastic arms of the first snap-fit member surround the second ring groove of the first bolt and extend obliquely toward a center of the first bolt, so as to form a plurality of barb structures for preventing the first bolt from being pulled out upward relative to a first ring member.

7. The loading assembly according to claim 4, wherein a first receiving chamber is formed in a lower surface of the pressing plate, the first snap-fit member is received in the first receiving chamber.

8. The loading assembly according to claim 4, wherein the first locking part is located between the second ring groove and the first thread portion of the first bolt, the first locking part is a ring convex part formed on the rod of the first bolt, and an end face of the first locking part is pressed against the end face of the first nut.

9. A loading assembly, comprising:
a base plate configured to support a circuit board placed thereon;
a pressing plate configured to press an electrical member on the circuit board;
a first connection assembly connecting the pressing plate to the base plate and pressing the electrical member on the circuit board through the pressing plate, the first connection assembly includes a first nut fixed on the base plate, a first bolt passing through the pressing plate and screwed to the first nut, and a first spring sleeved on the first bolt and compressed between a head of the first bolt and the pressing plate, a first locking part is formed on the first bolt, the first locking part is located above a first thread portion of the first bolt configured to mate with the first nut, the first locking part is pressed against an end face of the first nut when the first bolt is screwed to an installation position to prevent the first bolt from being rotated relative to the first nut to lock the first bolt at the installation position; and
a cooling plate provided on the pressing plate, the cooling plate having a bottom bulge which passes through an opening formed in the pressing plate and contacts the electrical member.

10. The loading assembly according to claim 9, wherein the loading assembly includes a second connection assembly for connecting the cooling plate to the base plate, the second connection assembly applying an elastic pushing force on the cooling plate to press the electrical member on the circuit board with the cooling plate.

11. The loading assembly according to claim 10, wherein the second connection assembly includes a second nut fixed on the base plate, a second bolt passing through the cooling plate and the pressing plate and screwed into the second nut, and a second spring sleeved on the second bolt and compressed between a head of the second bolt and the cooling plate.

12. The loading assembly according to claim 11, wherein the first nut and the second nut pass through the base plate and the circuit board, so as to position the circuit board on the base plate.

13. The loading assembly according to claim 11, wherein a second locking part is formed on the second bolt, the second locking part being located above a second thread portion of the second bolt configured to mate with the second nut, the second locking part is pressed against an end face of the second nut when the second bolt is screwed to an installation position to prevent the second bolt from being rotated relative to the second nut to lock the second bolt at the installation position.

14. The loading assembly according to claim 13, wherein the second connection assembly includes a second sleeve sleeved on a rod of the second bolt, the second sleeve is supported on the cooling plate, an upper end of the second spring abuts against the head of the second bolt and a lower end of the second spring abuts against the second sleeve.

15. The loading assembly according to claim 14, wherein a first ring groove is formed on the rod of the second bolt, the second connection assembly includes a second snap ring held in the first ring groove of the second bolt, the second snap ring is located below the second sleeve and abuts against a lower end face of the second sleeve to prevent the second sleeve from being separated from the second bolt.

16. The loading assembly according to claim 15, wherein the second sleeve includes a tubular main body and a flange at an upper end of the tubular main body, the flange protruding outwards in a radial direction of the second sleeve, the tubular main body of the second sleeve is inserted into a second receiving hole formed in the cooling plate, the flange of the second sleeve is supported on the cooling plate, the upper end of the second spring abuts against the head of the second bolt and the lower end of the second spring abuts against the flange of the second sleeve.

17. The loading assembly according to claim 16, wherein a second ring groove is formed on the rod of the second bolt, the second connection assembly includes a second snap-fit member held in the second ring groove of the second bolt, the second snap-fit member is located below the second receiving hole of the cooling plate and an outer diameter of the second snap-fit member is larger than a diameter of the second receiving hole of the cooling plate to prevent the second bolt from being pulled out of the second receiving hole of the cooling plate.

18. The loading assembly according to claim 17, wherein the second snap-fit member has a plate-shaped ring main body and a plurality of elastic arms extending downward obliquely from the plate-shaped ring main body, the plurality of elastic arms are latched in the second ring groove of the second bolt and an outer diameter of the plate-shaped ring main body is larger than the diameter of the second receiving hole of the cooling plate.

19. The loading assembly according to claim 18, wherein the plurality of elastic arms of the second snap-fit member surround the second ring groove of the second bolt and extend obliquely toward a center of the second bolt, so as to form a plurality of barb structures preventing the second bolt from being pulled out upward relative to the second ring member.

20. The loading assembly according to claim 17, wherein the second locking part is located between the second ring groove and the second thread portion of the second bolt, the second locking part is a ring convex part formed on the rod of the second bolt, an end face of the second locking part is pressed against the end face of the second nut.

21. A loading assembly, comprising:
a base plate for supporting a circuit board placed thereon;
a pressing plate for pressing an electrical member on the circuit board; and
a first connection assembly connecting the pressing plate to the base plate and pressing the electrical member on the circuit board through the pressing plate, the first connection assembly including:
a first nut fixed on the base plate;
a first bolt passing through the pressing plate and screwed to the first nut, the first bolt defining a ring groove formed on a rod thereof; and
a first spring sleeved on the first bolt and compressed between a head of the first bolt and the pressing plate, a first locking part is formed on the first bolt, the first locking part is located above a first thread portion of the first bolt configured to mate with the first nut, the first locking part preventing the first bolt from being rotated relative to the first nut to lock with the first bolt in an installation position; and
a snap-fit member held in the ring groove and located below a first receiving hole of the pressing plate, an outer diameter of the snap-fit member is larger than a diameter of the first receiving hole of the pressing plate to prevent the first bolt from being pulled out of the first receiving hole of the pressing plate.

22. The loading assembly according to claim 21, wherein the snap-fit member includes a plate-shaped ring main body and a plurality of elastic arms extending downward obliquely from the plate-shaped ring main body, the plurality of elastic arms are adapted to be latched in the ring groove of the first bolt, and an outer diameter of the plate-shaped ring main body is larger than the diameter of the first receiving hole of the pressing plate.

\* \* \* \* \*